United States Patent
Cake et al.

(10) Patent No.: US 8,386,208 B2
(45) Date of Patent: Feb. 26, 2013

(54) METHOD AND APPARATUS FOR TRIGGER SCANNING

(75) Inventors: Anthony Cake, Givrins (CH); Peter Pupalaikis, Ramsey, NJ (US); David Graef, Campbell Hall, NY (US); William Driver, Warwick, NY (US); Michael Hertz, Washington Township, MI (US); Laxmikant Joshi, Tappan, NY (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 485 days.

(21) Appl. No.: 12/163,147

(22) Filed: Jun. 27, 2008

(65) Prior Publication Data

US 2009/0281748 A1   Nov. 12, 2009

Related U.S. Application Data

(63) Continuation-in-part of application No. 12/117,160, filed on May 8, 2008.

(51) Int. Cl.
*G06F 19/00* (2011.01)
*G01R 23/16* (2006.01)

(52) U.S. Cl. ..................... 702/123; 324/76.12

(58) Field of Classification Search ............. 702/123, 702/57–60, 64–73, 75–76, 78–79, 81, 84, 702/108, 116–121, 124–126, 176, 179–180, 702/182–183, 189; 324/76.11–76.13, 76.19, 324/76.22, 76.26–76.27, 76.39, 76.41, 121 R; 345/3.2, 10–11
See application file for complete search history.

(56) References Cited

U.S. PATENT DOCUMENTS

| | | | |
|---|---|---|---|
| 4,647,915 A | 3/1987 | Shank et al. | |
| 4,743,844 A | 5/1988 | Odenheimer et al. | |
| 4,926,067 A | 5/1990 | Whiteley | |
| 5,123,034 A * | 6/1992 | Grujon | 377/19 |
| 5,923,161 A | 7/1999 | Frankovitch et al. | |
| 6,396,517 B1 | 5/2002 | Beck et al. | |
| 6,615,148 B2 | 9/2003 | Pickerd | |
| 6,624,829 B1 | 9/2003 | Beck et al. | |
| 6,639,607 B1 | 10/2003 | Ferguson et al. | |
| 6,690,398 B1 | 2/2004 | Beck et al. | |
| 6,707,474 B1 | 3/2004 | Beck et al. | |
| 6,812,688 B2 | 11/2004 | Tan et al. | |
| 6,850,852 B1 | 2/2005 | Ferguson et al. | |
| 6,892,150 B2 * | 5/2005 | Pickerd et al. | 702/67 |
| 7,191,079 B2 | 3/2007 | Smith et al. | |
| 7,228,348 B1 | 6/2007 | Farley et al. | |
| 7,409,617 B2 | 8/2008 | Almy et al. | |
| 7,508,844 B2 | 3/2009 | Amagai | |
| 7,676,044 B2 | 3/2010 | Sasaki et al. | |

(Continued)

OTHER PUBLICATIONS

Hertz, M., Waveform Scanning Solves Power-Design Challenges, Mar. 2007, Power Electronics Technology, 5 pp.*

(Continued)

*Primary Examiner* — Toan Le
(74) *Attorney, Agent, or Firm* — Gordon Kessler

(57) ABSTRACT

A method and apparatus for determining a trigger in a test and measurement apparatus are provided. The method includes the steps of indicating one or more anomalies to be found, loading a first trigger configuration to the test and measurement apparatus and determining for a first predetermined time period whether an input signal generates a trigger related to one or more of the one or more anomalies. A second trigger configuration is loaded to the test and measurement apparatus upon the conclusion of the first predetermined time, and for a second predetermined time it is determined whether the input signal generates a trigger related to one or more of the one or more anomalies.

36 Claims, 8 Drawing Sheets

U.S. PATENT DOCUMENTS

| | | |
|---|---|---|
| 7,765,086 B2 | 7/2010 | Hillman, Jr. et al. |
| 7,996,168 B2 | 8/2011 | Kushnick |
| 2005/0271087 A1 | 12/2005 | Amagai |
| 2006/0129355 A1* | 6/2006 | Hillman et al. ............... 702/185 |
| 2007/0061629 A1 | 3/2007 | Thums et al. |
| 2009/0281759 A1* | 11/2009 | Cake et al. .................... 702/123 |

OTHER PUBLICATIONS

"Digital Phosphor Oscilloscopes and Digital Serial Analyzers", Nov. 12, 2007, DPO/DSA70000, Series Tektronix, pp. 1-16.*

"Oscilloscope Display Quality Impacts Ability to Uncover Signal Anomalies", Feb. 17, 2005, Agilent 6000 Series Scope versus Tektronix TDS3000 Series Scope, Application Note 1552 Agilent Technologies, pp. 1-12.*

"Agilent Technologies 6000 Series oscilloscopes", Mar. 1, 2006, Data Sheet, pp. 1-28.*

"Digital Phosphor Oscilloscopes and Digital Serial Analyzers", *DPO/DSA70000 Series Tektronix*, (Nov. 12, 2007), 1-16.

"Oscilloscope Display Quality Impacts Ability to Uncover Signal Anomalies", *Agilent 6000 Series Scope versus Tektronix TDS3000 Series Scope*, Application Note 1552 Agilent Technologies,(Feb. 17, 2005), 1-12.

"Agilent Technologies 6000 Series Oscilloscopes", *Data Sheet*, (Mar. 1, 2006), 1-28.

\* cited by examiner

METHOD AND APPARATUS FOR TRIGGER SCANNING

CROSS REFERENCE TO RELATED APPLICATIONS

This application is a continuation in part application of U.S. patent application Ser. No. 12/117,160 filed May 8, 2008, titled "Method and Apparatus for Triggering a Test and Measurement Instrument", currently pending, the contents thereof being incorporated herein by reference

FIELD OF THE INVENTION

The present invention relates to a method and apparatus for triggering a test and measurement apparatus such as an oscilloscope, and more particularly to a method and apparatus for scanning a plurality of trigger events to automatically determine a best option for the trigger for capturing rare events. Furthermore, the test and measurement apparatus may then be automatically set to trigger subsequently employing the determined trigger option.

BACKGROUND OF THE INVENTION

One of the main uses of various test and measurement instruments, and in particular an oscilloscope, is in a debug environment. A digital storage oscilloscope (DSO) is one of the primary tools of engineers in the development, debugging and certification of all kinds of electronic items.

As a debug tool, it is important for the oscilloscope to find anomalous events quickly. This is generally for two purposes. One purpose is to show evidence of a suspected problem. Another is to show enough about a problem to enable the setting up of the trigger to isolate the problem. Isolation of the problem is accomplished by repeatedly triggering on a problem and viewing the behavior at various circuit locations to identify cause-and-effect relationships.

A good way to show evidence of problems is to trigger repeatedly on an edge of a waveform. With digital oscilloscopes, it is possible to build up a persistence view showing the multiple triggers overlapping. In this way, presumably an infrequent behavior occurring on the edge is captured.

Steps in a typical debug scenario that can utilize such a DSO might include:

Develop a hypothesis of a problem (i.e. a glitch is on the clock line).

Develop evidence of the problem (i.e. see the glitch on the scope screen). This step is generally accomplished by setting up the DSO to trigger on an edge and generating a persistence map. After repeatedly triggering on the edge, perhaps eventually the glitch will be included in the picture and the evidence is found.

Isolate the problem (i.e. repeatedly trigger on the glitch). Thus, the picture of the glitch determined in step 2 is used to set up smart triggers or other appropriate triggering scenarios to repeatedly trigger on the glitch so that a more complete picture of the glitch is provided.

Determine cause and effect relationships (i.e. probe the power supply line) while repeatedly triggering on the glitch as set up in step 3 to test the hypothesis of step 1.

However, when performing such a debugging process, the inventors of the present invention have determined that there is a potential problem with the DSO's capability as a debug tool when glitch or other trigger events are rare and an update rate of the DSO is slow (where rare and slow are relative terms). The metric of usefulness of the digital scope in capturing anomalies would be the number of anomalies per second that the oscilloscope can accumulate on the screen. This would be based on the edge rate of the waveform, the update rate of the oscilloscope, and the statistical frequency of anomalies on an edge:

$$AnomaliesPerSecond = \left\{ \begin{array}{ll} \frac{EdgeRate > MaxUpdateRate}{EdgeRate} & \frac{MaxUpdateRate}{otherwise} \end{array} \right\} \cdot AnomaliesPerEdge$$

This means that if the edge rate of the waveform does not exceed the update rate of the oscilloscope, then the scope captures every single edge (and therefore every single anomaly). The number of anomalies per second to the scope screen is equal to the edge rate multiplied by the number of anomalies per edge. When the edge rate of the waveform exceeds the update rate of the oscilloscope, the oscilloscope does not capture every edge and the number of anomalies per second to the screen is equal to the update rate of the oscilloscope multiplied by the anomalies per edge.

There are two ways to view this situation. One is to view the number of anomalies per second to screen as a metric of goodness. In this case, for high edge rates, the number of anomalies per second to screen for anomalies with a given rarity is directly proportional to the update rate of the oscilloscope. Another is to view a certain number of anomalies per second to the screen as a threshold of acceptance for debug use. In this case, the rarity of events that the oscilloscope is useful for finding is again directly proportional to the update rate. Either way, the oscilloscope with the highest update rate will be more useful for the purpose of finding anomalies.

For example, a glitch or other trigger event that occurs once per second may seem like a frequent event, but when it occurs on a one gigahertz clock, it occurs at the infrequent rate of once per billion edges. If the DSO is used with a typical update rate of two thousand updates per second, it will take:

$$1 \cdot 10^9 \frac{edge}{s} \cdot 1\frac{s}{event} \cdot 1\frac{update}{edge} \cdot \frac{s}{2000 \cdot update} =$$

$$500000 \cdot \frac{s}{event} = 139 \cdot \frac{hr}{event}$$

This is a hopelessly long time to wait to see an event at that frequency of occurrence. Even with a faster scope update rate, one still needs to see enough of the events to develop a picture that allows isolation with the smart trigger.

Therefore, it would be beneficial to provide a trigger scheme and apparatus that overcomes these drawbacks of the prior art.

SUMMARY OF THE INVENTION

In accordance with the present invention, a trigger scanning capability is provided that allows a number of different trigger types (or smart trigger types) to be scanned through and applied to an acquired signal. Each trigger in the trigger scanning sequence is first loaded into the DSO trigger sequence and applied to the input acquired signal. The DSO is armed, continues to scan the input acquired waveform employing the current trigger setup for a predetermined dwell time, and after passage of the dwell time, loads a next trigger setup from the trigger scan sequence. This process continues until either a trigger event is recognized, or all of the trigger setups in the trigger scan have been applied.

When such a trigger event is recognized utilizing one of the triggers employed in the trigger scan, the trigger settings can preferably be maintained in that state for subsequent triggers Alternatively, those trigger settings can be remembered by the DSO, and the sequence of triggers in the trigger scan can be completed. Thereafter, the stored settings may be loaded into the DSO to provide a best trigger setup for subsequent use. The trigger scan may also be set in a continuous mode where the trigger scan sequence resets after reaching the end and continuously applies the trigger sequence to the input acquired signal. User intervention preferably stops such a scan and allows for the selection, either by the user or automatically, of the trigger settings to be employed for subsequent triggering.

$$AnomaliesPerSecond = \frac{\begin{cases} EdgeRate \cdot AnomaliesPerEdge > MaxUpdate & MaxUpdateRate \\ EdgeRate \cdot AnomaliesPerEdge & \text{otherwise} \end{cases}}{TriggerSetups}$$

The trigger settings may be determined automatically by the DSO, either with or without user input. Thus, a user may indicate the types on anomalies he or she wishes to find. Trigger settings likely to find these anomalies may be generated for use in the trigger sequence. Alternatively, the DSO may simply suggest anomalies to look for based upon an analysis of the waveform. Furthermore, anomalies may be indicated by the user or automatically based upon statistical information related to the waveform, or pictorial information, such a persistence display or other provided display data.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combinations of elements and arrangement of parts that are adapted to effect such steps, all as exemplified in the following detailed disclosure, and the oscilloscope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

The method and apparatus operate by loading trigger setups, either simple or complex "smart" trigger setups, arming the oscilloscope, dwelling for a certain amount of time, then moving on to load a next trigger setup. When acquisitions occur at any setting, the acquired waveforms are preferably put into a persistence display.

In accordance with the invention, if one assumes that a particular anomaly is detected at one and only one of the trigger settings, then the number of anomalies per second displayed on the oscilloscope scope screen is calculated as follows:

The maximum number of anomalies per second displayed on the screen that can preferably be attained in accordance with the preferred embodiment of the invention is equal to the maximum oscilloscope update rate divided by the number of trigger setups. In general, this maximum rate will be greater than the threshold for usefulness in debug situations because the update rate of the oscilloscope will typically be at least an order of magnitude greater than the number of trigger setups used.

Until the anomalies per second limit in accordance with the preferred embodiment of the invention is reached, the number of anomalies per second acquired for a given frequency of anomalies is proportional to an edge rate. In other words, the effectiveness of the method and apparatus in accordance with the invention increases as edge speeds grow. Contrast this with the previous calculations provided in accordance with the prior art methods and apparatuses where for a given anomaly rate, the effectiveness of such a method and apparatus is a constant, independent of edge rate.

Therefore, in accordance with the invention, the inventors have determined a number of situations where the method and apparatus in accordance with the invention are particularly preferable to any prior art method and apparatus, namely the situations are when:

$$EdgeRate \geq MaxUpdateRate_{WOTS} \cdot TriggerSetups$$

AND $$AnomaliesPerEdge \leq \frac{\frac{MaxUpdateRate_{TS}}{MaxUpdateRate_{WOTS}}}{TriggerSetups}$$

Thus, the method and apparatus of the present invention are particularly advantageous when the edge rate is high and the anomalies are infrequent.

Figure 3:
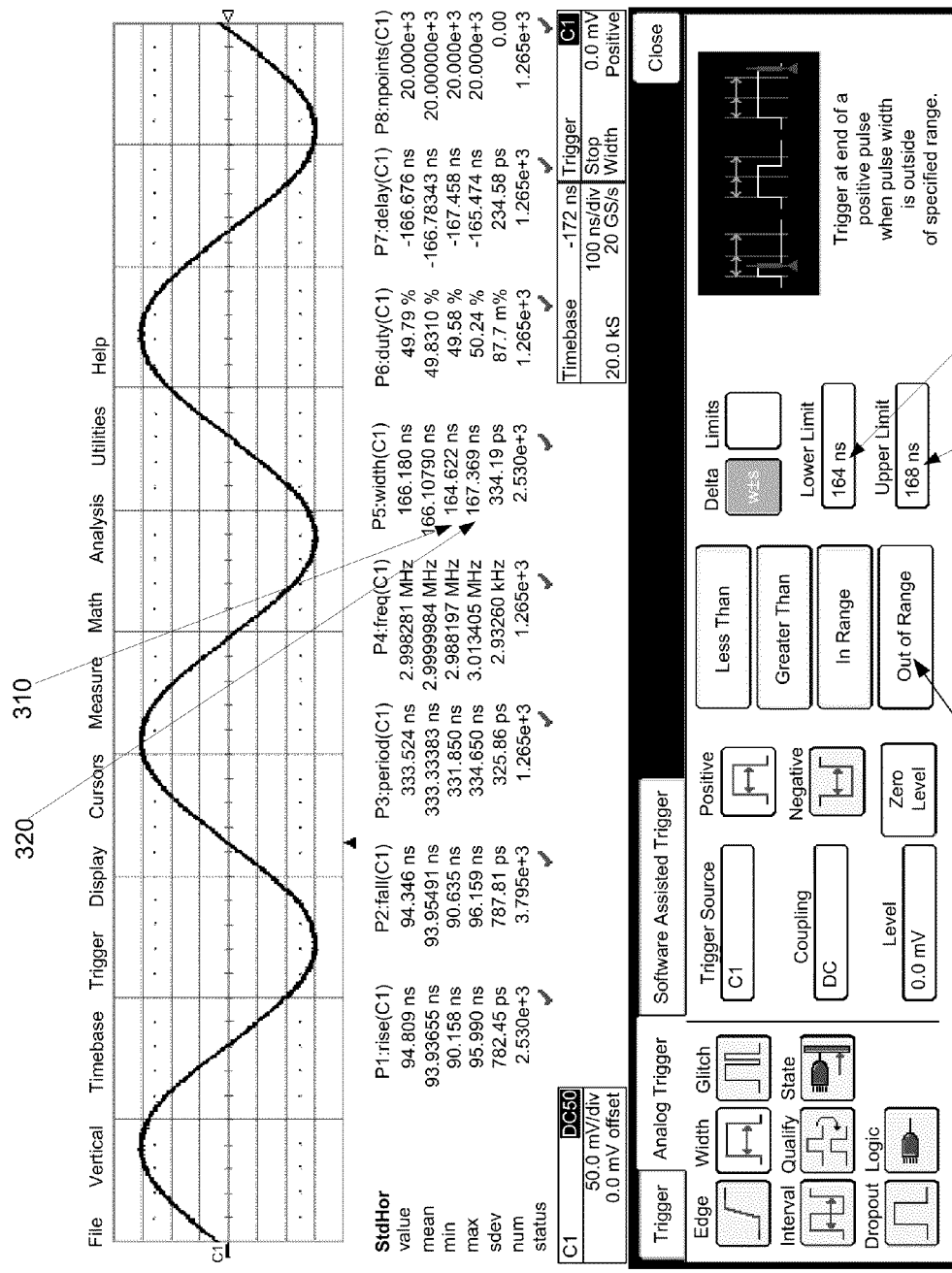
FIG. 3 is a screen shot depicting the use of parameter statistics for setting up a trigger in accordance with the invention.

Referring first to FIGS. 1A-1D, a method for implementing a trigger scan sequence in a test and measurement apparatus, preferably an oscilloscope, in accordance with a preferred embodiment of the invention will be described. At step 102, a trigger scan sequence is initiated. Such a trigger scan may be based upon parameter statistics that allow a user to determine appropriate trigger settings. In accordance with the invention, parameter statistics can be collected in advance of initiating the trigger scan sequence. As is shown in FIG. 3, in advance of various trigger scan functioning as will be described below, the test and measurement apparatus has measured more than 2500 pulse widths. Parameter statistics such as min, max, mean, and standard deviation have been computed. In the particular example shown in FIG. 3, a min pulse width value 310, is computed as 164.6 nanoseconds, and a max pulse width value 320, is computed as 167.4 nanoseconds. In accordance with these and other statistical calculations, the test and measurement apparatus may automatically configure one or more trigger settings to detect pulse widths outside of this range 330, or to detect other derivative parameters or features. To search for pulse widths outside of the typical statistical range of pulse width values, when utilizing a trigger based upon pulse width, a trigger pulse width minimum 340 is set to 164 nanoseconds, and maximum 350 is set to 168 nanoseconds.

Therefore in accordance with the invention, the oscilloscope application first may compute statistics on typical waveforms, and then may use this information to determine the appropriate trigger settings to search for anomalies. This use of statistical waveform information for automatic trigger configuration allows the trigger to determine its own settings to search for anomalies falling outside of a statistical range. This concept is not limited to the width parameter and width trigger, and may be applied to any measurement parameter which may provide information useful for automatic trigger configuration. Additionally, these various required trigger settings could be set by a user, defined in accordance with an agreed upon industry standard, or be set in any other appropriate manner.

Figure 5:
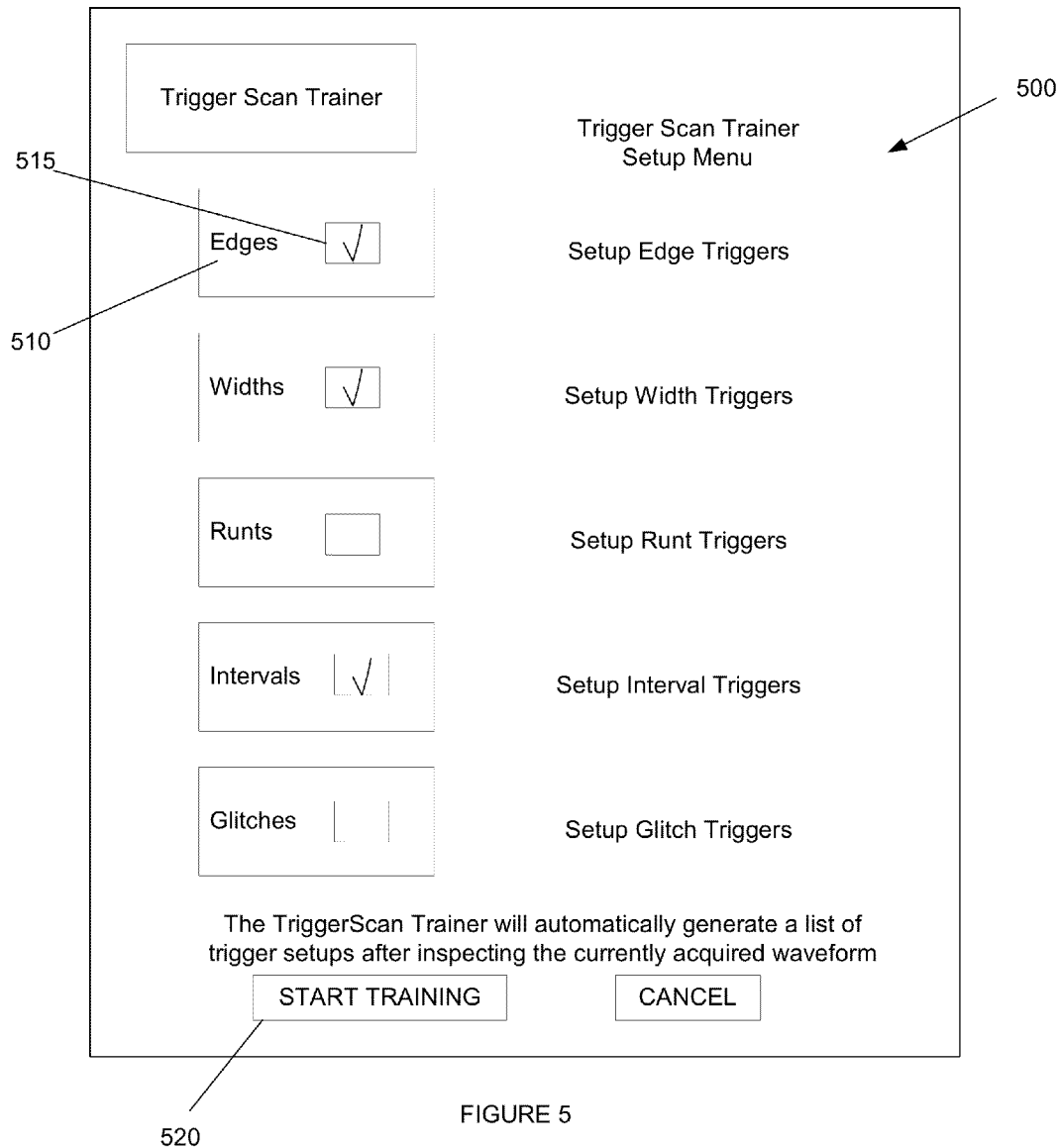
FIG. 5 is a diagram depicting an example of possible selections available to a user when defining one or more anomalies.

Further in accordance with the invention, the oscilloscope application may present the user can with an interactive option to automatically build a trigger scan sequence, as shown in FIG. 5. As is shown in FIG. 5, a simulated Trigger Scan setup menu 500 is shown. At the user's option, the user may guide the application to select from a list of various anomalies to search for, such as widths or glitches by placing a check mark 515 in a box corresponding to the description 510 of a desired anomaly for which the apparatus is to search. One, more than one, or all of the anomalies in the list may be selected. Of course, the listed anomalies are by way of example, and any number of anomalies or other waveform features may be provided for user selection. Alternatively, or in addition to the selection noted above, the user may enter nominal numerical information that describes the signal under test, and a particular parameter and value that the user wishes to trigger on and find. The user may either use default settings that are offered by the application or choose the options that are of interest. In this manner, the user is able to enter information regarding to any waveform or other parameter for which it is desired for the oscilloscope application look for and potentially generate a trigger.

The application may then use the options selected in conjunction with statistical waveform information calculated on a stored waveform to populate a sequence with trigger setups that are likely to find the anomalies parameters, or other information of which the user is interested, upon selection of the Start Trigger button 520. The user reserves the ability to modify or eliminate setups that the application chooses and continue to add others of interest. By this method, the user may guide the application to setup a trigger scan list using prior knowledge of the system under test.

As an alternative to using statistical waveform information, the application may automatically build a trigger scan list based on a persistence display of waveform information. By using a persistence display of the waveform, calculations can be performed on the pictorial waveform image, such as the frequency or pulse width, of the waveform and a scan list can be populated. This option may be interactive as well. Thus, a user may be able to indicate one or more features in a persistence or other display, thus using these features as a basis for implementing a trigger configuration, and utilizing such trigger configuration in a trigger scan file. While a persistence display is suggested, any pictorial or other displayed or stored information may comprise the basis for a measurement or other parameter valuation to form the basis for a trigger.

As a simplification of an interactive option from the application, the user might provide input, by pressing a button or soft key for example, that will indicate to the oscilloscope application to perform an automatic setup without presenting the user with any options to select. This may be useful in a situation where the user does not have much prior knowledge of the system under test. Thus, rather than providing the user with the ability to select various anomalies as in FIG. 5, the oscilloscope application performs an analysis of an input waveform, and based upon one or more determined characteristics, makes a further determination of likely trigger setups that will aid the user in finding anomalies or other information from the waveform. A trigger scan list may then be generated based upon this determined information, and may further be supplemented, edited, or the like in the manner described below.

While executing a trigger scan sequence in accordance with the invention, the oscilloscope application may be selectively enabled to periodically pause the scan expand or compact the list of trigger setups. The application may periodically capture and store statistical information about the waveforms or alternatively, use a persistence display, and determine additional trigger setups to use for the scan list or conclude that certain trigger setups are not desired. The application may modify the list dynamically and then resume execution of the new expanded or reduced trigger scan list. Furthermore, while the trigger scan sequence is being executed, the application may continuously compile and store statistical waveform information about the waveform and use this information to expand and/or compact the list.

Figure 4:
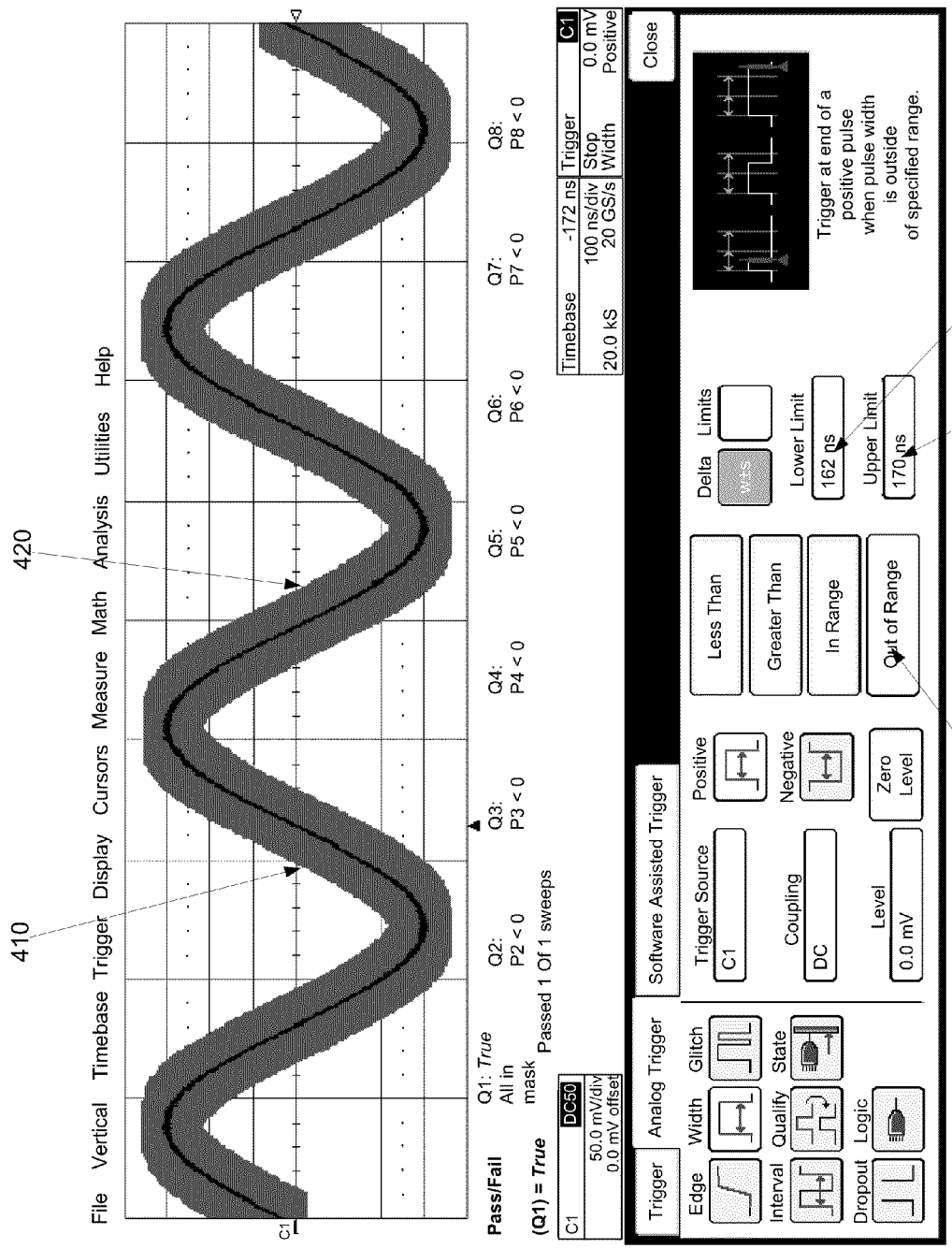
FIG. 4 is a screen shot depicting the use of an automatic fitting mask for setting up a trigger in accordance with the invention.

In addition to setting some of the trigger parameters by statistical analysis before including them in a trigger scan implementation, an automatic fitting mask (automask) may be applied to typical waveforms in advance of initiating the trigger scan sequence. As is further shown in FIG. 4, an automask has been applied to the input waveform, defining a uniform envelope around the waveform. The leftmost boundary of the pulse width defined by a mask 410, and rightmost boundary of the pulse width defined by a mask 420 are shown. The test and measurement apparatus may automatically configure the trigger settings to detect pulse widths outside of this range 430. To search for pulse widths outside of the typical statistical range of pulse width values, the trigger pulse width minimum 440 is set to 162 nanoseconds, and maximum 450 is set to 170 nanoseconds. Therefore the apparatus may first fit a mask to typical input waveforms, and then use the mask shape information to determine appropriate trigger settings to search for anomalies. This use of waveform masking for automatic trigger configuration allows the trigger to determine its own settings to search for anomalies falling outside of the statistical range. This concept is not limited to masks which determine the range of pulse widths, and could be applied to any mask shape results which may provide information useful for automatic trigger configuration. Additionally, these various required trigger settings could be set by a user, defined in accordance with an agreed upon industry standard, or be set in any other appropriate manner.

Furthermore, as is shown in FIG. 3, various choices for selecting and setting up a particular trigger configuration are provided. While not enumerated particularly, shown in menu selection area 250 (described in greater detail with reference to FIG. 2 below) are choices for a type of trigger to be selected, polarity, source, and values, as described above. It is the user of these various trigger definition tools that allows a user to set a particular trigger configuration that can then be stored to a trigger scan file and used in accordance with the invention, as will be described below.

Referring back to FIG. 1, at step 104, an inquiry is made as to whether a user wishes to utilize a pre-existing trigger scan file. If this inquiry is answered in the affirmative, processing passes to step 106 where the pre-existing trigger scan file is loaded into the test and measurement apparatus. At step 108, it is questioned whether the user wishes to edit the loaded trigger scan file. If so, processing passes to step 110 allowing for editing the trigger scan file, by, for example, saving a currently active trigger setup to the file or otherwise editing a sequence of triggers present in the file.

If at step 104 it is determined that the user does not wish to employ a pre-existing trigger scan file, processing then directly passes to step 110, allowing the editing of a new trigger scan file, as noted above. Upon the completion of editing, processing will pass to step 108, and when the user has completing all editing, the inquiry at step 8 will be answered in the negative, indicating that processing is complete, and processing will pass to step 115. Processing (regardless of the route 108) will allow a user to generate a new file, or edit an existing trigger scan file. Such a trigger scan file preferably includes one or more trigger settings including necessary information for setting the test and measurement apparatus to perform processing to implement each of the triggers in the file. Thus such a file will include a number of sequential states, each representing a trigger setting to be implemented on the test and measurement apparatus. These trigger states need not be stored in a file per se. It is within the scope of the invention for trigger types to be designated at runtime, utilized, and then not remembered by the apparatus. The term file is intended to refer to any method by which a sequence of triggers, whether stored permanently or not, is designated and then used to sequentially set up the apparatus.

At step 115, after the trigger scan file has been selected and edited as necessary, a mode of operation of the trigger scan sequence is determined. While any number of modes may be provided, in a preferred embodiment, three modes are available.

If at step 115 a continuous mode is selected, processing passes to step 120 to enter the continuous mode, and at step 122 the trigger scan sequence begins. Processing then proceeds, via steps 124, 126 (see FIG. 1B) to step 128 where a first trigger configuration is loaded from the trigger scan setup file. At step 130, a trigger scan is performed on an incoming waveform for a defined dwell time. This dwell time may be determined by the user, in accordance with the type of trigger being used, in accordance with the type of signal being tested, or any other appropriate parameter. During the dwell time, any trigger that is detected is stored, along with the current apparatus settings that generated the trigger at step 132. This is so the user may later return to the precise apparatus and trigger settings that generated the trigger. Because the trigger scan is operating in continuous mode, it is necessary for a user to actively stop the sequence of trigger scans when desired. Therefore, at step 134, it is determined whether a stop command is received. While this stop command is shown at a particular location in the sequence, it may be placed at any point. However, for simplicity of explanation, it is shown at only one location.

If at step 134 it is determined that a stop command has been received, processing is discontinued at step 139. The user may then review any triggers that were stored, and preferable selectively return the test and measurement apparatus to the state that generated the trigger. If there is no stop command, processing passes to step 136 where it is determined whether there are additional trigger configurations in the trigger scan setup file. If so, then at step 138 a next trigger configuration is loaded into the apparatus at step 138 and processing returns to step 130 to perform processing in accordance with the next trigger setup. If at step 136 it is determined that there are no additional trigger configurations in the trigger scan setup file, because the process is running in continuous mode, processing returns to step 128 where the first trigger configuration in the trigger scan setup file is loaded, and processing continues as during the first iteration.

If at step 115 the user selects to stop scanning on trigger mode event, such a mode is entered at step 150, and at step 152 the trigger scan sequence begins. Processing then proceeds, via steps 154, 156 (see FIG. 1C) to step 158 where a first trigger configuration is loaded from the trigger scan setup file. At step 160, a trigger scan is performed on an incoming waveform for a defined dwell time. This dwell time may be determined by the user, in accordance with the type of trigger being used, in accordance with the type of signal being tested, or any other appropriate parameter. During the dwell time, it is determined whether any trigger is received. If a trigger is received, processing ends at step 169, and the test and measurement apparatus is maintained in the state as when the trigger was generated. Thus, a user may easily further trigger the apparatus using these settings.

If at step 164 no trigger is detected, processing passes to step 166 where it is determined whether there are additional trigger configurations in the trigger scan setup file. If so, then a next trigger configuration is loaded into the apparatus at step 168 and processing returns to step 160 to perform processing in accordance with the next trigger setup. If at step 166 it is determined that there are no additional trigger configurations in the trigger scan setup file, because the process is running in a continuous mode, processing returns to step 158 where the first trigger configuration in the trigger scan setup file is loaded, and processing continues as during the first iteration.

If at step 115 the user selects a one pass mode, such a mode is entered at step 180, and at step 182 the trigger scan sequence begins. Processing then proceeds, via steps 184, 186 (see FIG. 1D) to step 188 where a first trigger configuration is loaded from the trigger scan setup file. At step 190, a trigger scan is performed on an incoming waveform for a defined dwell time. This dwell time may be determined by the user, in accordance with the type of trigger being used, in accordance with the type of signal being tested, or any other appropriate parameter. During the dwell time, it is determined whether any trigger is received. If a trigger is received, processing ends at step 199, and the test and measurement apparatus is maintained in the state as when the trigger was generated. Thus, a user may easily further trigger the apparatus using these settings.

If at step 194 no trigger is detected, processing passes to step 196 where it is determined whether there are additional trigger configurations in the trigger scan setup file. If so, then a next trigger configuration is loaded into the apparatus at step 198 and processing returns to step 190 to perform processing in accordance with the next trigger setup. If at step 196 it is determined that there are no additional trigger configurations in the trigger scan setup file, because the process is running in a one pass mode, processing ends at step 199 without finding a trigger.

While this one pass mode shows stopping processing upon determination of a trigger, it is also possible to complete the full pass, even if a trigger is detected. In this case, a storage step, such as that of step 132 in FIG. 1B may be employed, and the processing would continue until all trigger configurations had been implemented once. Similar to continuous mode, the user would be left with a number of stored trigger configurations that generated a trigger, any of which the user may reload into the apparatus to place the apparatus in a state similar to that when the trigger was generated.

The editing processing of step 108, and storing of current trigger setup of step 110 will now be more completely described. A trigger scan setup file is active, either through loading in step 106, or saving a current trigger file as in step 110. Once a trigger scan setup file has been generated, a user may either edit the particular settings of one or more of the sequence of triggers in the file or add a new trigger to the file. Editing may take place either by editing of a parameters file stored with the file, or by loading the configuration settings into the test and measurement apparatus, modifying the settings, and then resaving the setup to the file. To add an additional trigger to the file (or to start a file as in step 110) a user may simply set the trigger on the apparatus and save the settings to the trigger scan file, or may designate various trigger parameters. In either process, a trigger scan setup file is generated that includes one or more trigger settings that allow the test and measurement apparatus to sequentially load trigger setups without further user intervention, to allow for the searching of glitches or other interesting information in a waveform on an automated basis.

Figure 1A:
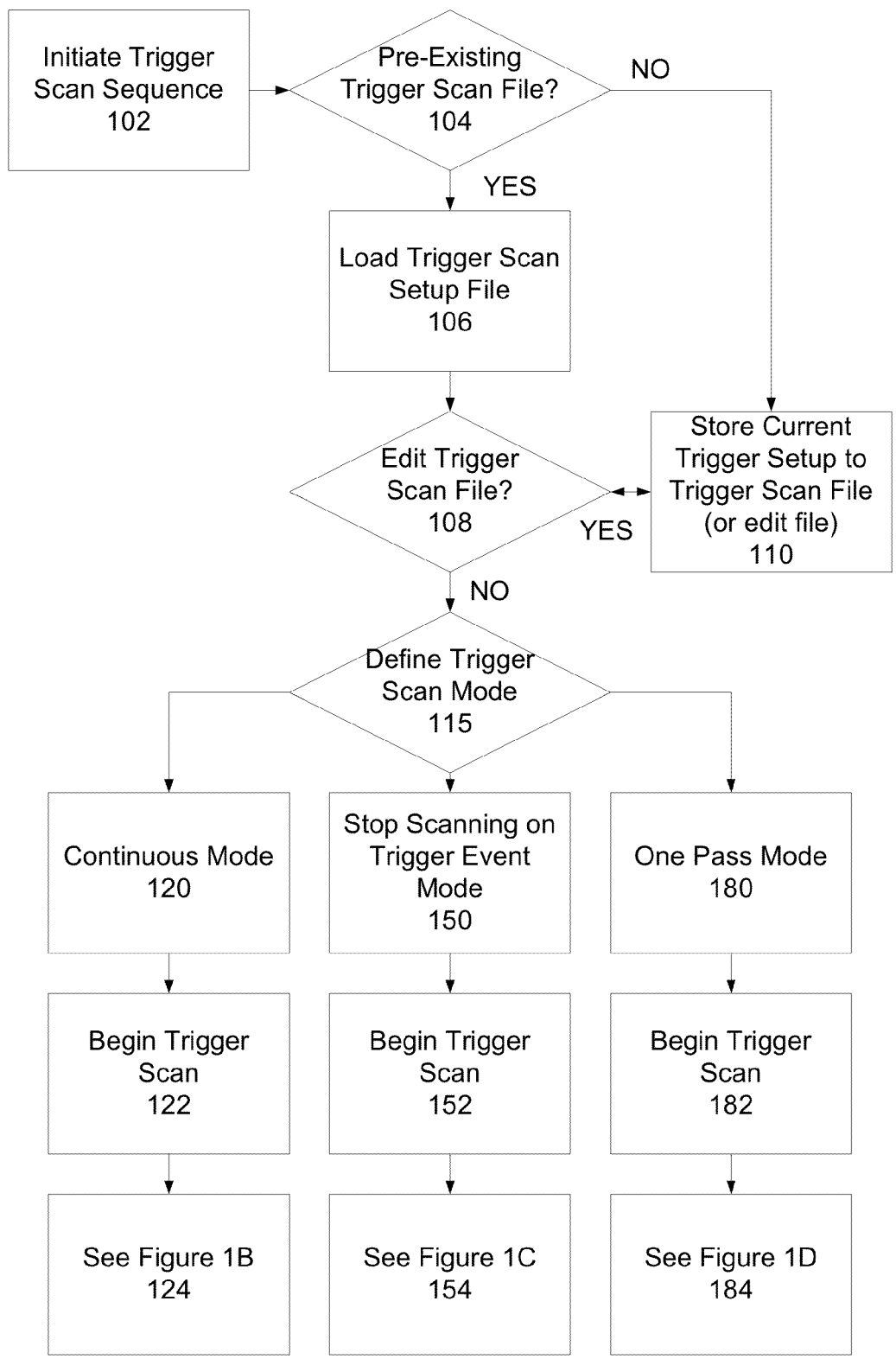
FIGS. 1A-1D comprise a flowchart diagram depicting processing utilized when employing a trigger scan scheme in accordance with an embodiment of the present invention.
Figure 1B:
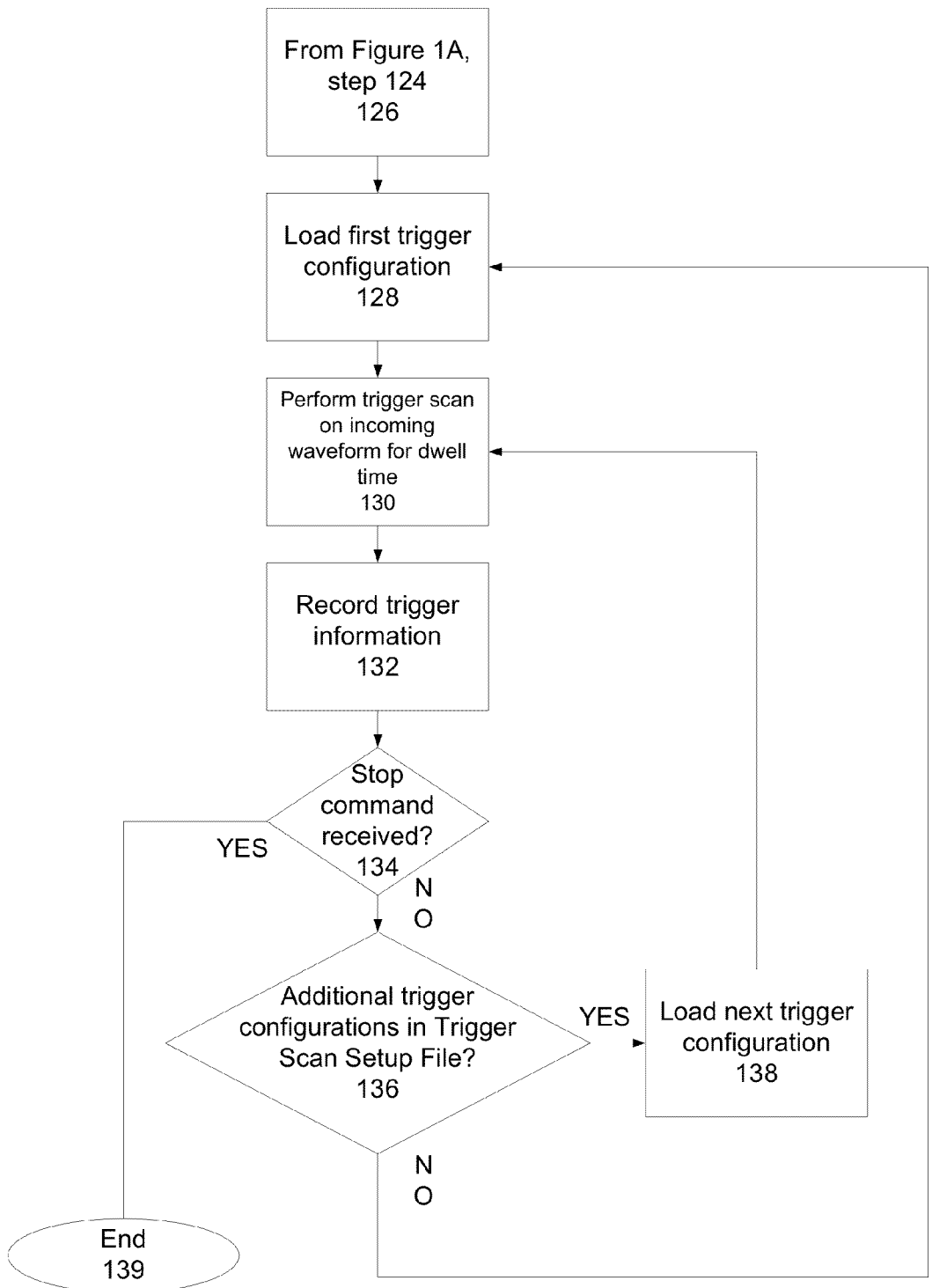
Figure 1C:
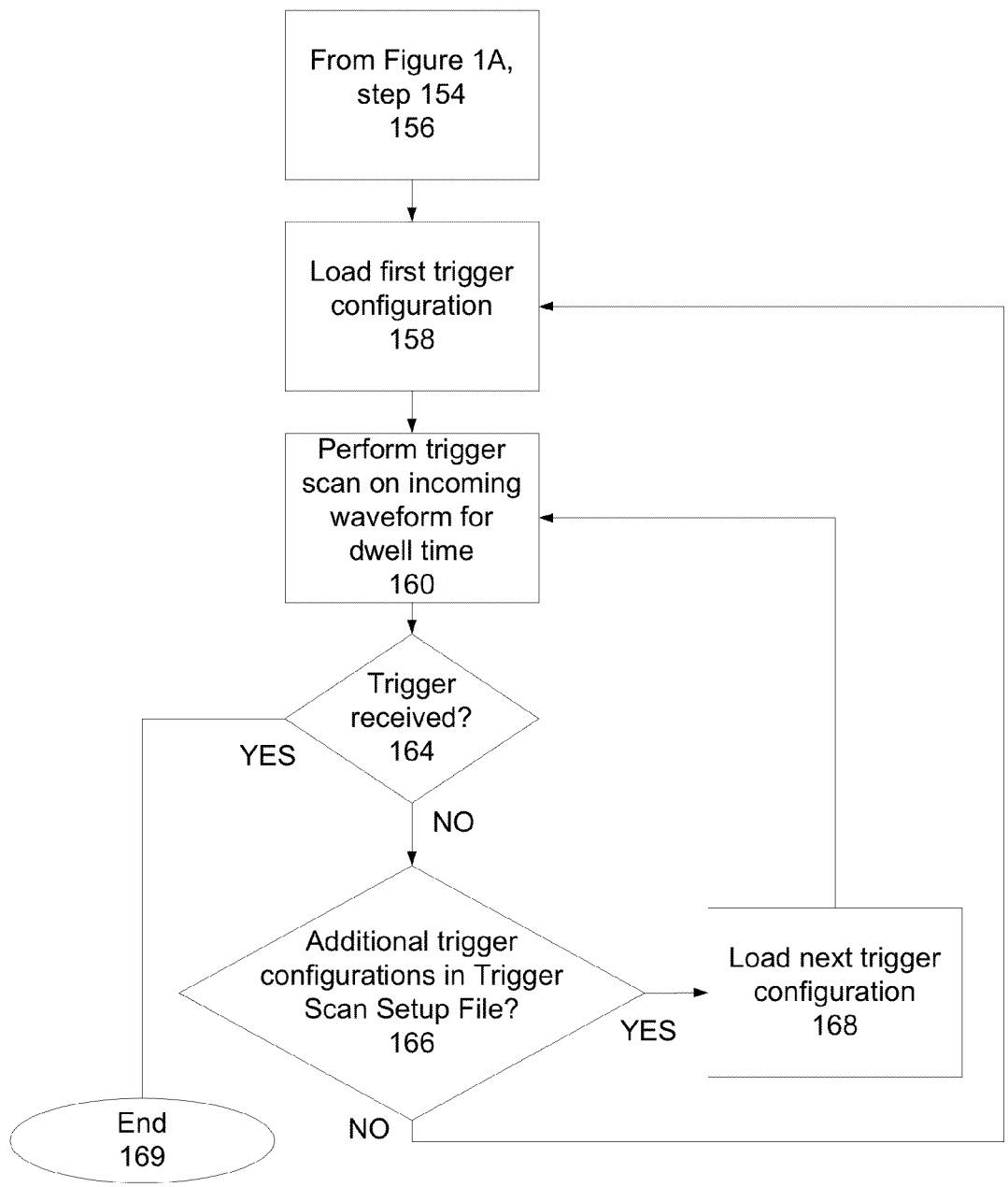
Figure 1D:
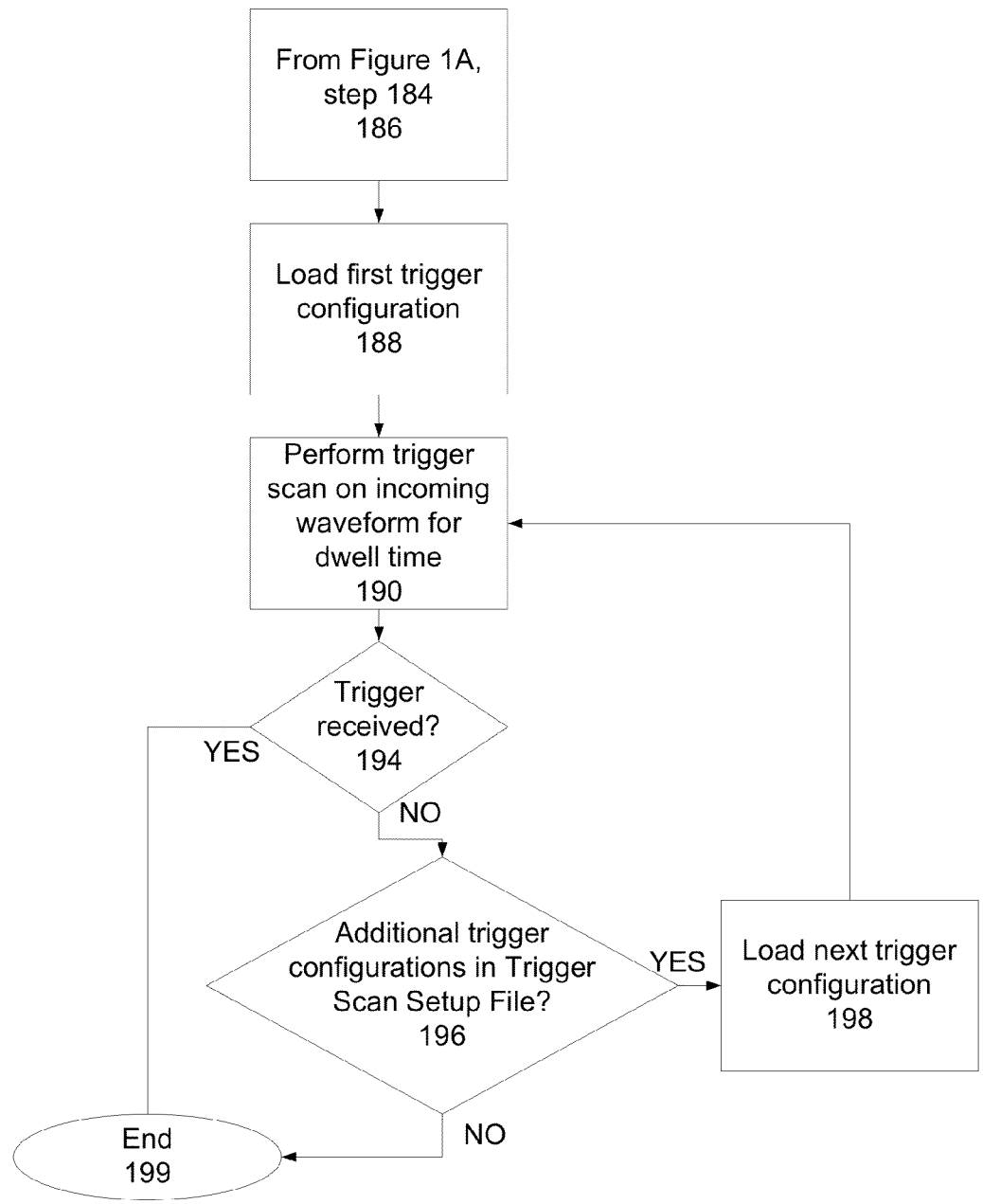
Figure 2:
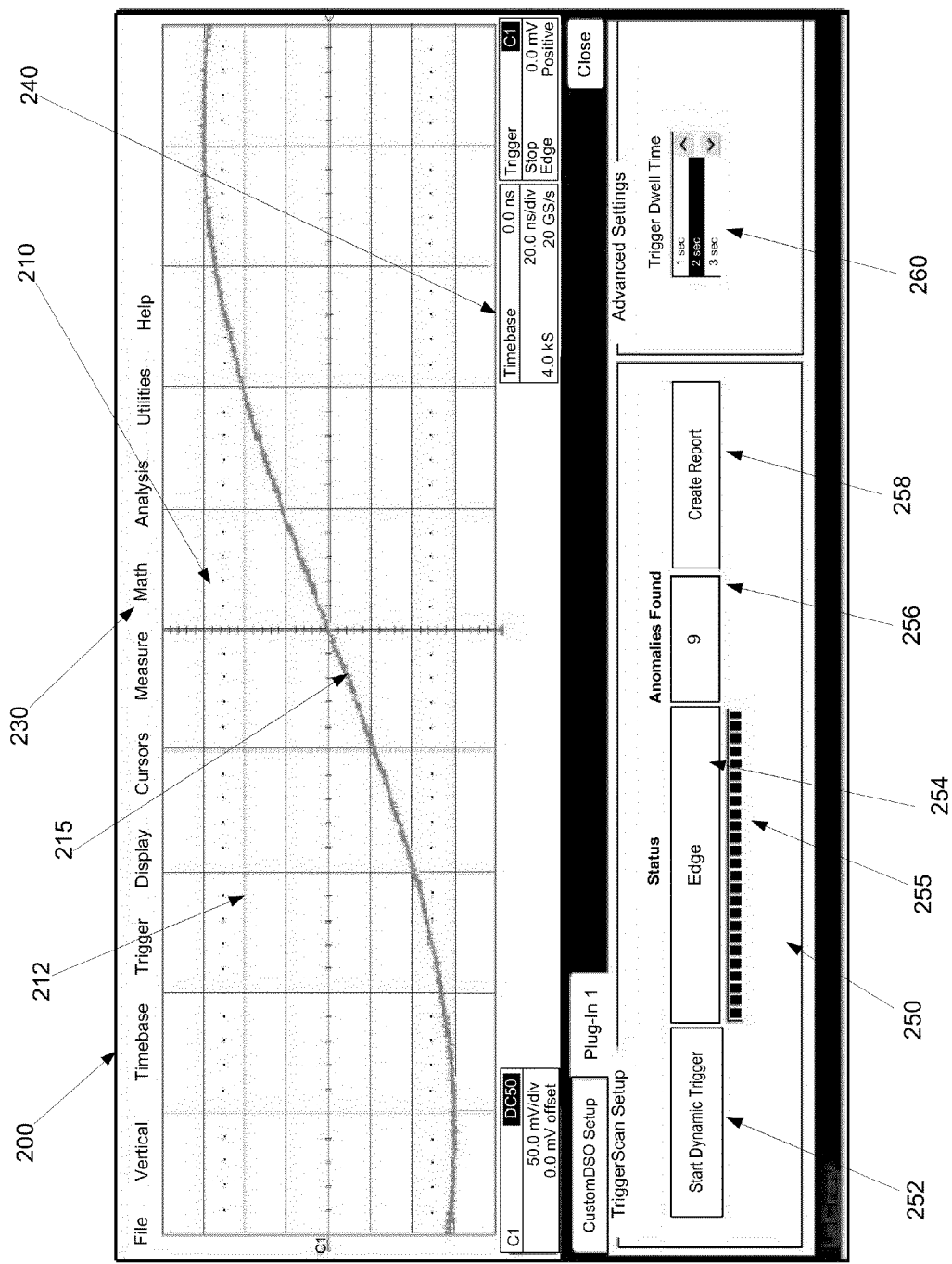
FIG. 2 is a screen shot depicting an exemplary user selection of one or more parameters in accordance with employment of the trigger scan scheme in accordance with an embodiment of the invention.

Referring next to FIG. 2, a screen shot depicting one exemplary mode in accordance with the present invention will now be described. In FIG. 2, a screen display 200 comprises a waveform display window 210, a menu selection list 230, a waveform information display 240, and a menu selection area 250. Waveform display window includes standard display attributes of a test and measurement apparatus, including a graticule 212 and a displayed waveform 215. In this particular case, waveform 215 comprises a plurality of waveform segments overlaid on each other generating a persistence map. Menu selection list 230 allows a user to adjust any number of settings as desired regarding the waveform, such as display characteristics, further analysis and processing, trigger settings and the like.

Waveform information display 240 shows information about the waveform or waveforms on the display. While any desired information may be shown, in this particular embodiment, displayed are the volts per division, offset, timebase and basic trigger settings. Menu selection area 250 in this particular embodiment is set up for a user to employ the features of the present invention, referred to in FIG. 2 as TriggerScan™. As is shown, a User is provided with a Start Dynamic Trigger button 252, a status bar indicating the trigger configuration currently employed, a status bar 255, a counter 256 for counting anomalies, a report button 258 and a trigger dwell time setting 260. These selections are shown by way of example only. It should be understood that any parameter may be provided to allow for a user selection. Furthermore, for example, the status window may depict all trigger configurations in a trigger scan file, and indicate by color or other means which trigger configuration is currently in use. A user may stop processing of the trigger configurations in a trigger scan file, resume as desired, or select a different trigger configuration in the trigger scan file with which to resume processing.

Additionally, rather than simply indicating a number of anomalies, it is contemplated in accordance with the invention to provide the persistence map of waveform 251, including each waveform segment containing an anomaly. If more than one trigger type generated an anomaly, then waveform 215 would likely have two different waveform segment shapes, one corresponding to each trigger configuration. In such a case, a table may be provided listing each trigger configuration that detected an anomaly, along with number or other information. A selection of one of the trigger configurations by a user from a list may preferably reload that trigger configuration into the test and measurement apparatus, thus providing a simple, user friendly method for continuing analysis using any of the trigger configurations that detected such an anomaly.

A user may also concatenate trigger setup files, either by editing them to form a single file, or by indicating that first all of the triggers for a first file are to be used, and then all of the triggers for a next. In such a case, during processing, an inquiry asking if any trigger configurations remained would be answered in the affirmative until all configurations in all designated filed had been completed.

It is preferable to provide a visual display of processing of the waveforms as they are being scanned. Such images may include a capture of waveform pieces that generated a particular trigger condition, or an image of the shape of a particular waveform parameter being searched for so that a user is able to view what the trigger scan implementation is searching for.

The invention also contemplates the test and measurement apparatus used to implement this trigger scheme including sufficient storage memory to store any trigger configuration settings, to allow for any number of trigger settings to be implemented. Additionally, it is contemplated that any of the trigger settings may further comprise conditional or other complex trigger types, such as qualification triggers or AB triggers. In such a situation, when a first trigger is detected, the processing then searches for a second trigger. Only when this second trigger is then detected is a true trigger in accordance with this invention found. The first and second triggers (or any number of conditional triggers) may comprise any type of trigger available in the test and measurement apparatus. Such complex triggers may include various hardware and software triggers.

Additionally, such triggers may be searched for over multiple input channels, such as searching for a first trigger on a first channel and then a second trigger on a second channel. When using multiple channels, these triggers need not occur sequentially, but may also occur substantially simultaneously. Thus, a trigger scan setup file may contain two or more trigger configurations that are designated to be implemented on different channels at substantially the same time. Only if the trigger is generated on both channels at once is the requisite condition met and a true trigger is found.

A convergence feature may also be provided that allows for convergence on particular trigger settings that may be most desirable for capturing a particular anomaly. Thus, based upon the triggers generated, either in response to a single or multiple trigger types, an analysis may provide a set of suggested trigger settings that will best capture the anomaly. This trigger setting may be stored in memory, similarly to any of the other trigger settings, and may alternatively be added temporarily or permanently to a trigger scan setup file to be included in a next iteration scan. In this manner, through repetitive processing, a best set of trigger settings may be arrived at, and subsequently used by a user. Furthermore, other analysis may be performed on the stored trigger settings (and accompanying waveform portions that generated the trigger, if stored) as desired by the user.

It will thus be seen that the objects set forth above, among those made apparent from the preceding description, are efficiently attained and, because certain changes may be made in carrying out the above method and in the constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method for determining a trigger in a test and measurement apparatus, comprising the steps of:
   (a) indicating one or more anomalies to be found;
   (b) providing a predetermined group of trigger configurations associated with the one or more anomalies stored to a non-transitory computer readable storage medium;
   (c) selecting one or more of the trigger configurations from the group;
   (d) loading a first selected trigger configuration to the test and measurement apparatus;
   (e) arming the test and measurement apparatus in accordance with the first loaded trigger configuration, and dwelling for a predetermined period of time;
   (f) determining for a first predetermined time whether a received input signal generates a trigger;
   (g) loading a second selected trigger configuration to the test and measurement apparatus upon the conclusion of the first predetermined time;
   (h) arming the test and measurement apparatus in accordance with the second loaded trigger configuration, and dwelling for a predetermined period of time;
   (i) determining for a second predetermined time whether the input signal generates a trigger; and
   (j) storing to a trigger scan setup file on a non-volatile computer readable medium of the test and measurement apparatus one or more of the first and second trigger configurations that failed to generate a trigger;
   (k) wherein the trigger scan setup file is employed by the test and measurement apparatus to setup a trigger for analysis of a future input signal.

2. The method of claim 1, wherein the first and second trigger configurations are determined at least in part in accordance with the one or more indicated anomalies.

3. The method of claim 2, wherein the first and second trigger configurations are determined at least in part in accordance with further information describing parameters of a signal under test.

4. The method of claim 2, wherein the first and second trigger configurations are determined at least in part in accordance with statistical information related to a waveform.

5. The method of claim 1, wherein the first and second trigger configurations are determined at least in part in accordance with a persistence display of waveform information.

6. The method of claim 5, wherein calculations for determining the first and second trigger configurations are performed in accordance with pictorial information displayed in accordance with the persistence display.

7. The method of claim 6, wherein the pictorial information comprises a frequency of the waveform.

8. The method of claim 6, wherein the pictorial information comprises pulse width.

9. The method of claim 6, wherein the pictorial information comprises one or more measureable parameters from the persistence display.

10. The method of claim 1, further comprising the step of storing in memory the first trigger configuration if it is determined that the input signal failed to generate a trigger during the first predetermined time.

11. The method of claim 10, further comprising the step of reloading the first trigger configuration into the test and measurement apparatus to place the apparatus in a state similar to that during the first predetermined time.

12. The method of claim 1, further comprising the step of storing in memory the second trigger configuration if it is determined that the input signal failed to generate a trigger during the second predetermined time.

13. The method of claim 12, further comprising the step of reloading the second trigger configuration into the test and measurement apparatus to place the apparatus in a state similar to that during the second predetermined time.

14. The method of claim 1, wherein processing as set forth in steps (a)-(i) is performed multiple times to load and test a further plurality of trigger configurations.

15. The method of claim 14, further comprising the step of generating a trigger setup list including one or more trigger conditions that failed to generate a trigger.

16. The method of claim 15, further comprising the step of removing a trigger condition from the trigger setup list.

17. The method of claim 15, further comprising the step of adding a trigger condition to the trigger setup list.

18. The method of claim 1, further comprising the steps of automatically generating a trigger setup list in accordance with the one or more trigger conditions that failed to generate a trigger.

19. The method of claim 1, wherein the test and measurement apparatus is an oscilloscope.

20. A method for generating a trigger scan setup file for use with a test and measurement apparatus, comprising the steps of:
   providing a predetermined group of trigger configurations associated with the test and measurement apparatus stored to a non-transitory computer readable storage medium;
   selecting a plurality of the trigger configurations from the group;
   sequentially processing the plurality of selected trigger configurations to determine one or more of the potential trigger configurations that fails to generate a trigger;
   generating a trigger scan setup file including each trigger configuration that failed to generate a trigger; and
   storing the trigger scan setup file on a non-volatile computer readable medium of the test and measurement apparatus;
   wherein the trigger scan setup file is employed by the test and measurement apparatus to setup a trigger for analysis of a future input signal.

21. The method of claim 20, further comprising the steps of:
   processing additional selected trigger configurations during operation of the test and measurement apparatus;
   identifying additional trigger configurations that fail to generate a trigger;
   adding these identified trigger configurations to the trigger scan setup file; and
   continue processing by the test and measurement apparatus in accordance with the updated trigger scan setup file.

22. The method of claim 21, wherein the additional trigger configurations are determined in accordance with further statistical information related to a waveform.

23. The method of claim 20, further comprising selection of an auto setup option to begin processing.

24. The method of claim 20, wherein the predetermined group of trigger configurations is determined in accordance with an analysis of a waveform.

25. The method of claim 24, wherein the analysis is performed in accordance with one or more of statistical waveform information, a persistence display, and other pictorial information.

26. The method of claim 20, wherein the predetermined group of trigger configurations are determined without substantial user input.

27. A test and measurement apparatus comprising:
one or more trigger settings; and
a processor for receiving information regarding one or more anomalies to be found, for providing a predetermined group of trigger configurations associated with the test and measurement apparatus stored to a non-transitory computer readable storage medium, selecting a plurality of the trigger configurations from the group, arming the test and measurement apparatus in accordance with a first selected trigger configuration, and dwelling for a predetermined period of time, storing the first selected trigger configuration comprising one or more trigger settings to a trigger scan setup file if it fails to generate a trigger, arming the test and measurement apparatus in accordance with a second selected trigger configuration, and dwelling for a predetermined period of time, and for storing the second selected trigger configuration comprising one or more trigger settings to the trigger scan setup file if it fails to generate a trigger,
wherein the trigger scan setup file is employed by the test and measurement apparatus to setup a trigger for analysis of a future input signal.

28. The test and measurement apparatus of claim 27, wherein a table is provided including a list of the first and second trigger configurations that failed to generate a trigger.

29. The test and measurement apparatus of claim 28, wherein selection of one of the list of the first and second trigger configurations loads the selected trigger configuration into the test and measurement apparatus.

30. The test and measurement apparatus of claim 27, wherein at least one of the first and second trigger configurations is determined in accordance with a parameter statistical analysis.

31. The test and measurement apparatus of claim 27, wherein the test and measurement apparatus is an oscilloscope.

32. A method for determining a trigger in a test and measurement apparatus, comprising the steps of:
providing a predetermined group of trigger configurations associated with the test and measurement apparatus and determined at least in part in accordance with a persistence display of waveform information stored to a non-transitory computer readable storage medium;
selecting one or more of the trigger configurations from the group;
loading a first selected trigger configuration to the test and measurement apparatus;
arming the test and measurement apparatus in accordance with the first loaded trigger configuration, and dwelling for a predetermined period of time;
determining for the first predetermined period of time whether an input signal generates a trigger in accordance with the first trigger configuration;
loading a second selected trigger configuration to the test and measurement apparatus
arming the test and measurement apparatus in accordance with the second loaded trigger configuration, and dwelling for a second predetermined period of time;
determining for the second predetermined time whether the input signal generates a trigger in accordance with the second trigger configuration; and
storing to a trigger scan setup file on a non-volatile computer readable medium of the test and measurement apparatus one or more of the first and second trigger configurations that failed to generate a trigger;
wherein the trigger scan setup file is employed by the test and measurement apparatus to setup a trigger for analysis of a future input signal.

33. The method of claim 32, wherein calculations for determining the first and second trigger configurations are performed in accordance with pictorial information displayed in accordance with the persistence display.

34. The method of claim 33, wherein the pictorial information comprises a frequency of the waveform.

35. The method of claim 33, wherein the pictorial information comprises pulse width.

36. The method of claim 33, wherein the pictorial information comprises one or more measurable parameters from the persistence display.

* * * * *